United States Patent
Kwon et al.

(10) Patent No.: US 6,989,716 B2
(45) Date of Patent: Jan. 24, 2006

(54) VARIABLE GAIN AMPLIFIER

(75) Inventors: Chong Ki Kwon, Daejon-Shi (KR);
Gyu Hyung Cho, Daejon-Shi (KR);
Mun Yang Park, Daejon-Shi (KR);
Jong Dae Kim, Daejon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 13 days.

(21) Appl. No.: 10/732,720

(22) Filed: Dec. 9, 2003

(65) Prior Publication Data

US 2004/0119536 A1  Jun. 24, 2004

(30) Foreign Application Priority Data

Dec. 12, 2002  (KR) .................... 10-2002-0079286

(51) Int. Cl.
*H03F 3/45*  (2006.01)
(52) U.S. Cl. ...................... 330/254; 330/293
(58) Field of Classification Search ............ 330/104, 330/253, 254, 257, 261, 288, 293
See application file for complete search history.

(56) References Cited

U.S. PATENT DOCUMENTS

| 5,146,180 | A | * | 9/1992 | Hyakutake | ................. | 330/254 |
| 5,418,494 | A | * | 5/1995 | Betti et al. | ................. | 330/254 |
| 5,757,230 | A | | 5/1998 | Mangelsdorf | | |
| 6,710,657 | B2 | * | 3/2004 | Yang | ................. | 330/254 |
| 6,724,235 | B2 | * | 4/2004 | Costa et al. | ................. | 330/254 |

FOREIGN PATENT DOCUMENTS

| JP | 61198805 | 9/1986 |
| JP | 6053766 | 2/1994 |

OTHER PUBLICATIONS

Siang Tong Tan and Jose Silva-Martinez, A 270 MHz, 1 Vpk-pk, Low-Distortion Variable Gain Amplifier in 0.35 um CMOS process, Texas A&M University, Analog and Mixed Signal Center, 2002, pp. 307-309.
W.C. Song, C.J. Oh, G.H. Cho and H.B. Jung, High frequency/high dynamic range CMOS VGA, Electronics Letters, vol. 36, No. 13, Jun. 22, 2000, pp. 1096-1098.

* cited by examiner

*Primary Examiner*—Khanh V. Nguyen
(74) *Attorney, Agent, or Firm*—Blakely, Sokoloff, Taylor & Zafman

(57) ABSTRACT

Disclosed is a variable gain amplifier having low voltage, low distortion, high linearity and wideband operating characteristics. The variable gain amplifier comprises an input signal provision and variable gain controller for receiving first and second input signals via a differential pair of a cascode shape and amplifying a difference signal of the first and second input signals to output first and second differential signals, wherein the controller controls a variable voltage gain of the difference signal according to a gain control voltage signal, and a current/voltage converter for receiving the first and second differential signals outputted from the input signal provision and variable gain controller and converting the first and second differential signals into first and second output voltages of a voltage inputted type depending on first and second bias voltages, wherein the input signal provision and variable gain controller has a construction of a current inputted type or a voltage inputted type along with negative feedback connection.

13 Claims, 3 Drawing Sheets

US 6,989,716 B2

VARIABLE GAIN AMPLIFIER

BACKGROUND OF THE INVENTION

1. Field of the Invention

The present invention relates to a variable gain amplifier, and more particularly, to a CMOS variable gain amplifier with low power consumption characteristics, which can operate at a low supply voltage.

2. Background of the Related Art

Performance parameters of VGA, that must be considered in designing a CMOS variable gain amplifier (hereinafter called 'CMOS VGA') may include maximization of signal to noise ratio (S/N ratio) for a desired signal value, a frequency bandwidth, low distortion, a low input noise characteristic, the input signal that guarantees a target linearity, a noise characteristic, a control voltage signal, a gain control characteristic (exponential gain characteristic), and the like.

Furthermore, parameters that must be considered in designing the CMOS VGA may include dependency on temperature and power supply voltage by the CMOS characteristic. In particular, it is not easy to design the CMOS circuit having an operating frequency range of over 100 MHz in view of device technology characteristics. Furthermore, the value of the input/output signal is limited due to limitations in reduction of the threshold voltage in the MOS device. It is thus difficult to expect a smooth operation for a low supply power. As a result, it is difficult to implement the CMOS VGA with a low power consumption characteristic at the low voltage.

SUMMARY OF THE INVENTION

Accordingly, the present invention is contrived to substantially obviate one or more problems due to limitations and disadvantages of the related art, and an object of the present invention is to provide a variable gain amplifier, which can provide a function of variable gain for a large input signal range according to an external control voltage in a low supply voltage, and accomplish low distortion, high linearity and wideband characteristics.

Another object of the present invention is to provide a CMOS variable gain amplifier with low power consumption, which can be implemented as IC.

Still another object of the present invention is to provide an IC embedded CMOS VGA having low power consumption.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a variable gain amplifier according to the present invention comprises an input signal provision and variable gain controller for first and second input signals through a differential pair with a cascode input scheme and amplifying a difference signal of the first and second input signals to output first and second differential signals, wherein the controller controls a variable voltage gain of the difference signal according to a gain control voltage signal, and a current/voltage converter for receiving the first and second differential signals outputted from the input signal provision and variable gain controller and converting the first and second differential signals into first and second output voltages of a voltage inputted type depending on first and second bias voltages, wherein the input signal provision and variable gain controller is negatively feed-backed from the current/voltage converter and thus has the construction of a current inputted type or the voltage inputted type.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
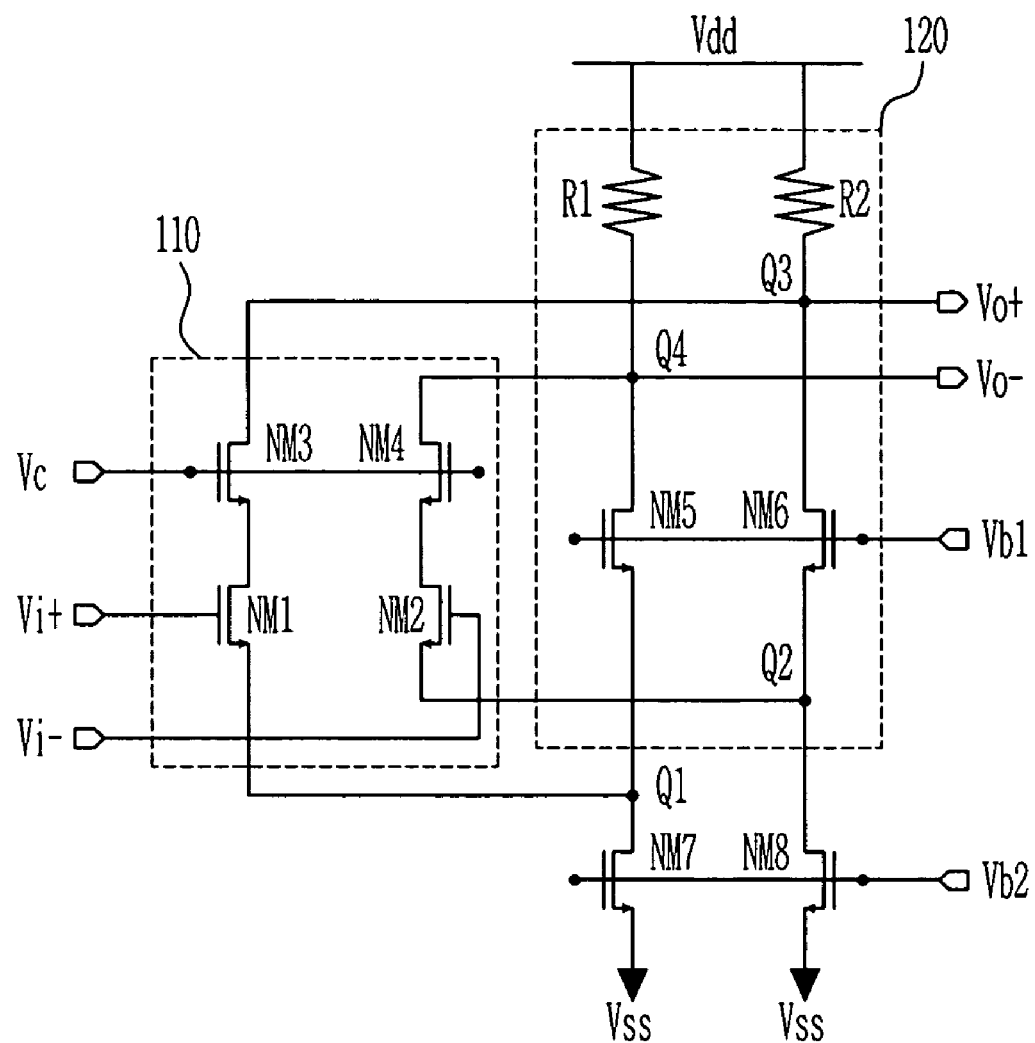
FIG. 1 is a detailed circuit diagram illustrating a CMOS variable gain amplifier ('CMOS VGA') according to a first embodiment of the present invention.

Reference will now be made in detail to the preferred embodiments of the present invention, examples of which are illustrated in the accompanying drawings, in which like reference numerals are used to identify the same or similar parts.

Figure 2:
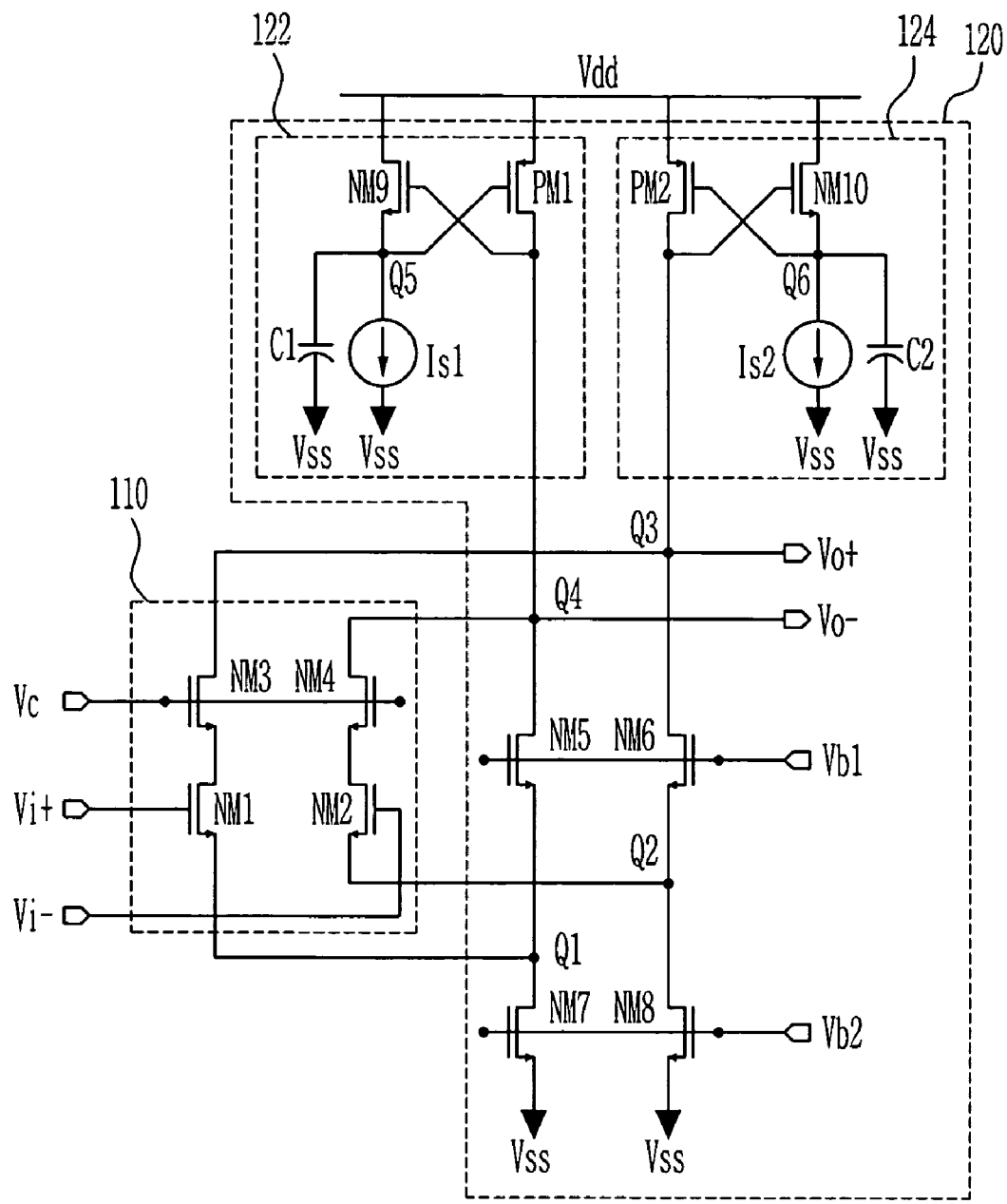
FIG. 2 is a detailed circuit diagram illustrating a CMOS variable gain amplifier according to a second embodiment of the present invention.
Figure 3:
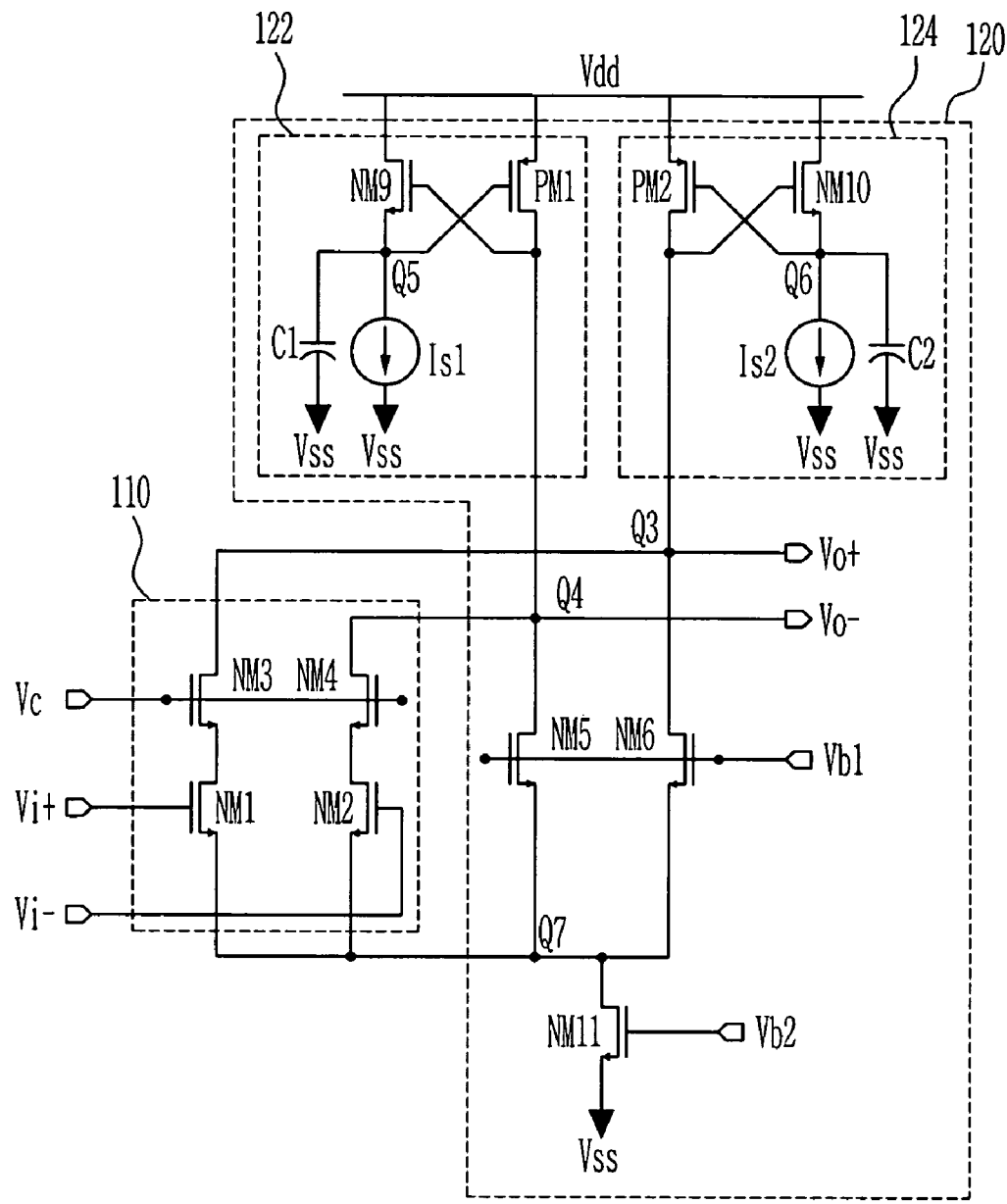
FIG. 3 is a detailed circuit diagram illustrating a CMOS variable gain amplifier according to a third embodiment of the present invention.

FIG. 1 is a detailed circuit diagram illustrating a CMOS variable gain amplifier ('CMOS VGA') according to a first embodiment of the present invention, FIG. 2 is a detailed circuit diagram illustrating a variable gain CMOS amplifier according to a second embodiment of the present invention, and FIG. 3 is a detailed circuit diagram illustrating a variable gain CMOS amplifier according to a third embodiment of the present invention.

Referring to FIG. 1~FIG. 3, the CMOS VGA according to the first embodiment of the present invention includes an input signal provision and variable gain controller 110 and a current/voltage (I/V) converter 120.

[Input Signal Provision and Variable Gain Controller]

The input signal provision and variable gain controller 110 has a current inputted type, as shown in FIG. 1 and FIG. 2. The controller 110 amplifies input signals (Vi+, Vi−) inputted through the differential pair of a cascode input shape, wherein the controller 110 controls the variable gain of the input signals (Vi+, Vi−) using its transconductance that is varied depending on a gain control voltage (Vc) signal. Meanwhile, a variable gain controller 110 according to the third embodiment of the present invention has a voltage inputted type, as shown in FIG. 3, unlike the first and second embodiments.

In the concrete, the input signal provision and variable gain controller 110 includes NMOS transistors NM1~NM4.

The NMOS transistors NM1~NM4 constitute the differential pair of the cascode input shape in order to minimize the miller effect and parasitic capacitance components. As shown in FIG. 1 and FIG. 2, the NMOS transistor NM1 is connected to a node Q1 and a source terminal of the NMOS transistor NM3 in the cascode input shape and operates as the current inputted type according to the input signal (Vi+). The NMOS transistor NM2 is connected to a node Q2 and a source terminal of the NMOS transistor NM4 in the cascode input shape and operates as the current inputted type according to the input signal (Vi−).

Meanwhile, as shown in FIG. 3, a NMOS transistor NM1 is connected to a node Q7 and a source terminal of a NMOS transistor NM3 in the cascode input shape and operates according to the input signal (Vi+). A NMOS transistor NM2 is connected to the node Q7 and a source terminal of a NMOS transistor NM4 in the cascode input shape and operates according to the input signal (Vi−). In other words, in FIG. 3, the source terminals of the NMOS transistors NM1 and NM2 are commonly connected to the node Q7 to become the voltage inputted type. Further, a NMOS transistor NM3 is connected to a node Q3 being the output node and a drain terminal of the NMOS transistor NM1 and operates as a common gate amplifier according to the gain control voltage (Vc) signal. The NMOS transistor NM4 is connected to a node Q4 being the output node and a drain terminal of the NMOS transistor NM2 and operates as the common gate amplifier in accordance with a gain control voltage (Vc) signal.

An operational characteristic of the input signal provision and variable gain controller 110 will be described below. The NMOS transistor NM1 and the NMOS transistor NM3 operate in a triode region or a saturation region depending on the gain control voltage (Vc) signal. It is thus possible to minimize a distortion phenomenon regardless of the values of the input signals (Vi+, Vi−). Accordingly, if the input signals (Vi+, Vi−) are inputted to the NMOS transistors NM1 and NM2 and the gain control voltage (Vc) signal is inputted to the gate terminals of the NMOS transistors NM3 and NM4, the operating point of the NMOS transistors NM1 and NM3 or the NMOS transistors NM2 and NM4 having the cascode input shape is moved from the saturation region to the triode region, and vice versa, depending on the gain control voltage (Vc) signal. This reduces the distortion phenomenon depending on the values of the input signals (Vi+, Vi−). Further, the construction of the cascode input shape allows the output terminals (Vo+ and Vo−) to have high impedance, whereby the voltage gain is made high.

For example, if there is a need to reduce the variable gain since high input signals (Vi+, Vi−) are inputted, the gain control voltage (Vc) signal is made low the value of transconductance of each of the NMOS transistors NM3 and NM4 is thus reduced, whereby the variable gain is reduced. In this case, the NMOS transistors NM3 and NM4 each having the gate terminal to which the gain control voltage (Vc) signal is inputted and the NMOS transistors NM1 and NM2 having the gate terminals to which the input signals (Vi+, Vi−) are each inputted operate in the saturation region. Accordingly, distortion of the high input signals (Vi+, Vi−) is minimized to improve the linearity.

On the contrary, if there is need to increase the variable gain since low input signals (Vi+, Vi−) are inputted, the gain control voltage (Vc) signal is made high and the transconductance of each of the NMOS transistors NM3 and NM4 is thus increased, whereby the variable gain is increased. In this case, the NMOS transistors NM3 and NM4 each having the gate terminal to which the gain control voltage (Vc) signal is inputted operate in the saturation region and the NMOS transistors NM1 and NM2 having the gate terminals to which the input signals (Vi+, Vi−) are each inputted operate in the triode region. Accordingly, it is possible to minimize distortion of the input signals (Vi+, Vi−) regardless of the values of the input signals (Vi+, Vi−).

As in the above, the drain current and the transconductance in the triode region and the saturation region can be expressed into the following mathematical equations 1~4.

In other words, in the triode operating region, $$i_d = \frac{\mu_o \cdot C_{ox} \cdot W}{L}\left[(V_{gs} - V_{TH}) - \frac{V_{ds}}{2}\right] \cdot V_{ds} \quad \text{[Equation 1]}$$

$$g_m = \frac{dI_d}{dV_{gs}} = \frac{\mu_o \cdot C_{ox} \cdot W}{L} \cdot V_{ds} \quad \text{[Equation 2]}$$

wherein $0 < V_{ds} < (V_{gs} - V_{TH})$ and $V_{TH}'$ is the threshold voltage of the transistor.

Further, in the saturation operating region, $$i_d = \frac{\mu_o \cdot C_{ox} \cdot W}{L}[(V_{gs} - V_{TH})^2] \quad \text{[Equation 3]}$$

$$g_m = \frac{dI_d}{dV_{gs}} \cong \sqrt{\frac{2(\mu_o \cdot C_{ox} \cdot W)}{L} \cdot I_d} \quad \text{[Equation 4]}$$

[Current/Voltage Converter]

In FIG. 1 and FIG. 2, the current/voltage converter 120 receives a differential signal of the current inputted type outputted from the input signal provision and variable gain controller 110, and uses the resistor load or the active load to output the differential signal of the current inputted type as the output voltages (Vo+, Vo−).

In the concrete, the current/voltage converter 120 comprises resistors R1 and R2 for converting the differential signal of the current inputted type inputted from the input signal provision and variable gain controller 110 into the output voltages (Vo+, Vo−) of the voltage inputted type, as shown in FIG. 1. As shown in FIG. 2 and FIG. 3, however, the current/voltage converters 120 according to the second and third embodiments of the present invention each includes active load circuits 122 and 124 in lieu of the resistors R1 and R2 in the first embodiment.

The reason why the active load circuits 122 and 124 are used instead of the resistors in the current/voltage converter 120 according to the second and third embodiments of the present invention, is for improving a frequency characteristic of the CMOS VGA. In other words, as shown in FIG. 2 and FIG. 3, reciprocal numbers ($1/g_{m,PMOS}$) of transconductances of PMOS transistors PM1 and PM2 are approximate output loads. Also, the PMOS transistors PM1 and PM2 allows a low voltage operation and at the same time supply a stabilized bias, together with NMOS transistors NM9 and NM10 and current sources Is1 and Is2. Frequency compensation capacitors C1 and C2 can improve the frequency characteristic. Accordingly, the CMOS VGA according to the second and third embodiments can operate with higher gain, lower voltage and wideband than the load having the resistors R1 and R2 in the first embodiment. Furthermore, there is an advantage that the CMOS VGA of the second and third embodiments can operate at a frequency region higher than the first embodiment, using the capacitors C1 and C2 that serve as frequency compensation capacitance.

The active load circuit 122 includes the PMOS transistor PM1, the NMOS transistor NM9, the current source Is1 and the capacitor C1. The PMOS transistor PM1 is connected between the power supply voltage source Vdd and the node Q4 and is driven by the potential of the node Q5. The NMOS transistor NM9 is connected between the power supply voltage source Vdd and the node Q5 and is driven by the potential of the node Q4. Further, the PMOS transistor PM1 and the NMOS transistor NM9 constitute a reciprocal negative feedback. The current source Is1 is connected between the ground voltage source Vss and the node Q5 and provides the current bias of the active load circuit 122. The frequency compensation capacitor C1 is connected in parallel to the current source Is1 and improves the frequency characteristic.

The active load circuit 124 includes the PMOS transistor PM2, the NMOS transistor NM10, the current source Is2 and the capacitor C2. The PMOS transistor PM2 is connected between the power supply voltage source Vdd and the node Q3 and is driven by the potential of the node Q6. The NMOS transistor NM10 is connected between the power supply voltage source Vdd and the node Q6 and is driven by the potential of the node Q3. Further, the PMOS transistor PM2 and the NMOS transistor NM10 constitute a reciprocal negative feedback. The current source Is2 is connected between the ground voltage source Vss and the node Q6 and provides the current bias of the active load circuit 124. The frequency compensation capacitor C2 is connected in parallel to the current source Is2 and improves the frequency characteristic.

For example, the operating characteristic of the active load circuit 122 will be now described. The PMOS transistor PM1 is driven as a load. The NMOS transistor NM9 forms the reciprocal negative feedback together with the PMOS transistor PM1 driven as the load. Further, in the active load circuit 122, the stabilized bias current is decided by the values of the PMOS transistor PM1 and the NMOS transistor NM9 and the current source Is1. Thus, a CMRR(common mode rejection ratio) becomes higher than when using the resistor load. Accordingly, the output voltages (Vo+, Vo−) outputted to the nodes Q3 and Q4, respectively, keep a more stable voltage level. The capacitor C1 has a zero frequency [$\{w_z=(gm\_M9)/(C_1+C_p)\}$] together with the output impedance when being viewed from each of the nodes Q3 and Q4. Thus, a desired gain can be obtained from a desired operating frequency by controlling the value of the capacitor C1. The same operation to the above is performed even in the active load circuit 124 having the NMOS transistor NM10, the PMOS transistor PM2, the current source Is2 and the capacitor C2.

Meanwhile, the current/voltage converter 120 further includes NMOS transistors NM5 and NM6, and NMOS transistors NM7 and NM8 for providing the DC operating point, i.e., the DC bias, as shown in FIG. 1 and FIG. 2 each illustrating the first and second embodiments. Meanwhile, the current/voltage converter 120 shown in FIG. 3 illustrating the third embodiment further includes NMOS transistors NM5 and NM6, and a NMOS transistor NM11.

As shown in FIG. 1 and FIG. 2, the NMOS transistors NM5 and NM6 of the current/voltage converter 120 supply the DC bias according to a bias voltage Vb1 inputted from the outside, so that the output voltages (Vo+, Vo−) can full swing. The NMOS transistors NM7 and NM8 operate as current mirrors depending on a bias voltage Vb2, and provide the bias current.

In order for the CMOS VGA to operate as above, the NMOS transistor NM5 is connected between the node Q4 and the node Q1 and is driven by the bias voltage (Vb1). The NMOS transistor NM6 is connected between the node Q3 and the node Q2 and is driven by the bias voltage (Vb1). The NMOS transistor N7 is connected between the node Q1 and the ground voltage source Vss and is driven by the bias voltage (Vb2). The NMOS transistor NM8 is connected between the node Q2 and the ground voltage source Vss and is driven by the bias voltage (Vb2). For this, the NMOS transistors NM5~NM8 operate in the saturation region.

Furthermore, as shown in FIG. 3, the NMOS transistors NM5 and NM6 in the current/voltage converter 120 according to the third embodiment supply the DC bias depending on the bias voltage (Vb1) inputted from the outside so that the output voltages (Vo+, Vo−) can full swing. The NMOS transistor NM11 operates as a current source according to the bias voltage (Vb2) and provides the bias current. In other words, the NMOS transistor NM11 operates as the current source of the NMOS transistors NM1 and NM2 in the input signal provision and variable gain controller 110. By means of this construction, the variable gain controller 110 has a voltage inputted type.

In order for the CMOS VGA to operate as above, the NMOS transistor NM5 is connected between the node Q4 and the node Q7 and is driven by the bias voltage (Vb1). The NMOS transistor NM6 is connected between the node Q3 and the node Q7 and is driven by the bias voltage (Vb1). The NMOS transistor N11 is connected between the node Q7 and the ground voltage source Vss and is driven by the bias voltage (Vb2).

As described above, the present invention has a new effect that it can provide a variable gain amplifier having a function of variable gain for an input signal of a wide range by an external control voltage signal in a low supply voltage, and having low distortion, high linearity and wideband characteristics.

Furthermore, the present invention has an outstanding effect that it allows a variable gain amplifier to be embedded in the IC than the variable gain amplifier using other devices, by constructing the amplifier using the MOS transistor.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A variable gain amplifier, comprising:
   an input signal provision and variable gain controller for receiving first and second input signals via a differential pair of a cascode input shape and amplifying a difference signal of the first and second input signals to output first and second differential signals, wherein the controller controls a variable voltage gain of the difference signal according to a gain control voltage signal; and
   a current/voltage converter for receiving the first and second differential signals outputted from the input signal provision and variable gain controller and converting the first and second differential signals into first and second output voltages of a voltage inputted type depending on first and second bias voltages, wherein the input signal provision and variable gain controller is under a negative feedback from the current/voltage converter and thus has the construction of a current inputted type or the voltage inputted type.

2. The variable gain amplifier as claimed in claim 1, wherein the input signal provision and variable gain controller comprises:
   a first NMOS transistor having a source terminal connected to a first node of the current/voltage converter and a gate terminal to which the first input signal is inputted;
   a second NMOS transistor constituting a differential type together with the first NMOS transistor, and having a source terminal connected to a second node of the current/voltage converter and a gate terminal to which the second input signal is inputted;
   a third NMOS transistor having a source terminal connected to a drain terminal of the first NMOS transistor and a drain terminal connected to a third node of the current/voltage converter, and driven by the gain control voltage signal; and
   a fourth NMOS transistor having a source terminal connected to a drain terminal of the second NMOS transistor and a drain terminal connected to a fourth node of the current/voltage converter, and driven by the gain control voltage signal.

3. The variable gain amplifier as claimed in claim 2, wherein the first and third NMOS transistors and the second and fourth NMOS transistors operate in a saturation region or a triode region depending on the gain control voltage signal.

4. The variable gain amplifier as claimed in claim 1, wherein the input signal provision and variable gain controller comprises:
   a first NMOS transistor having a source terminal connected to a fifth node of the current/voltage converter and a gate terminal to which the first input signal is inputted;
   a second NMOS transistor forming a differential type along with the first NMOS transistor, and having a source terminal connected to the fifth node of the current/voltage converter and a gate terminal to which the second input signal is inputted;
   a third NMOS transistor having a source terminal connected to a drain terminal of the first NMOS transistor and a drain terminal connected to a third node of the current/voltage converter, and driven by the gain control voltage signal; and
   a fourth NMOS transistor having a source terminal connected to a drain terminal of the second NMOS transistor and a drain terminal connected to a fourth node of the current/voltage converter, and driven by the gain control voltage signal.

5. The variable gain amplifier as claimed in claim 4, wherein the first and third NMOS transistors, and the second and fourth NMOS transistors operate in a saturation region or a triode region according to the gain control voltage signal.

6. The variable gain amplifier as claimed in claim 1, wherein the current/voltage converter comprises:
   a first resistor connected between a power supply voltage source and a first node to which the first differential signal is inputted;
   a second resistor connected between the power supply voltage source and a second node to which the second differential signal is inputted; and
   a DC bias means connected between the first and second resistors and the ground voltage source and operating as a current source according to the first and second bias voltage, for providing a DC bias of the first and second output voltages outputted from the current/voltage converter.

7. The variable gain amplifier as claimed in claim 6, wherein the DC bias means comprises:
   a first NMOS transistor connected between the first node and a fourth node for negative feedback of a first current to the input signal provision and variable gain controller, and driven by the first bias voltage;
   a second NMOS transistor connected between the second node and a third node for negative feedback of a second current to the input signal provision and variable gain controller, and driven by the first bias voltage;
   a third NMOS transistor connected between the third node and the ground voltage source and driven by the second bias voltage; and
   a fourth NMOS transistor connected between the fourth node and the ground voltage source and driven by the second bias voltage.

8. The variable gain amplifier as claimed in claim 6, wherein the DC bias means comprises:
   a first NMOS transistor connected between the first node and a fourth node for negative feedback of a voltage to the input signal provision and variable gain controller, and driven by the first bias voltage;
   a second NMOS transistor connected between the second node and the third node and driven by the first bias voltage;
   a third NMOS transistor connected between the third node and the ground voltage source and driven by the second bias voltage; and
   a fourth NMOS transistor connected between the fourth node and the ground voltage source and driven by the second bias voltage.

9. The variable gain amplifier as claimed in claim 1, wherein the current/voltage converter comprises:
   a first active load circuit connected between a power supply voltage source and a first node to which the first differential signal is inputted;
   a second active load circuit connected between the power supply voltage source and a second node to which the second differential signal is inputted; and
   a DC bias means connected between the first and second active load circuits and a ground voltage source, and driven as a current source according to the first and second bias voltages, for providing a DC bias of the first and second output voltages outputted from the current/voltage converter.

10. The variable gain amplifier as claimed in claim 9, wherein the first active load circuit comprises:
    a first PMOS transistor connected between the power supply voltage source and the first node and driven by the potential of a third node;
    a first NMOS transistor constituting a reciprocal negative feedback along with the first PMOS transistor, connected between the supply voltage source and the third node, and driven by the potential of the first node;
    a first current source connected between the third node and the ground voltage source, for providing a bias current of the first active load circuit; and
    a frequency compensation capacitor connected between the third node and the ground voltage source, for improving a frequency characteristic of the first active load circuit.

11. The variable gain amplifier as claimed in claim 9, wherein the second active load circuit comprises:
- a first PMOS transistor connected between the supply voltage source and the second node and driven by the potential of a third node;
- a first NMOS transistor constituting a reciprocal negative feedback along with the first PMOS transistor, connected between the power supply voltage source and the third node, and driven by the potential of the second node;
- a first current source connected between the third node and the ground voltage source, for providing a bias current of the second active load circuit; and
- a frequency compensation capacitor connected between the third node and the ground voltage source, for improving a frequency characteristic of the second active load circuit.

12. The variable gain amplifier as claimed in claim 9, wherein the DC bias means comprises:
- a first NMOS transistor connected between the first node and a fourth node for negative feedback of a first current to the input signal provision and variable gain controller, and driven by the first bias voltage;
- a second NMOS transistor connected between the second node and a third node for negative feedback of a second current to the input signal provision and variable gain controller, and driven by the first bias voltage;
- a third NMOS transistor connected between the third node and the ground voltage source and driven by the second bias voltage; and
- a fourth NMOS transistor connected between the fourth node and the ground voltage source and driven by the second bias voltage.

13. The variable gain amplifier as claimed in claim 9, wherein the DC bias means comprises:
- a first NMOS transistor connected between the first node and a fourth node for negative feedback of a voltage to the input signal provision and variable gain controller, and driven by the first bias voltage;
- a second NMOS transistor connected between the second node and a third node and driven by the first bias voltage;
- a third NMOS transistor connected between the third node and the ground voltage source and driven by the second bias voltage; and
- a fourth second NMOS transistor connected between the fourth node and the ground voltage source and driven by the second bias voltage.

* * * * *